(12) United States Patent
Hein et al.

(10) Patent No.: US 6,905,773 B2
(45) Date of Patent: Jun. 14, 2005

(54) CORROSION-RESISTANT COATINGS AND METHODS OF MANUFACTURING THE SAME

(75) Inventors: Gerald F. Hein, Cincinnati, OH (US); Brad Knapp, Kutztown, PA (US); Greg Agnew, Carmel, IN (US)

(73) Assignee: Schlage Lock Company, Indianapolis, IN (US)

( * ) Notice: Subject to any disclaimer, the term of this patent is extended or adjusted under 35 U.S.C. 154(b) by 10 days.

(21) Appl. No.: 10/277,711

(22) Filed: Oct. 22, 2002

(65) Prior Publication Data

US 2004/0076837 A1 Apr. 22, 2004

(51) Int. Cl.$^7$ ............................................... P32B 15/04
(52) U.S. Cl. ....................... 428/450; 428/446; 428/448; 428/701; 428/702; 428/624; 428/336
(58) Field of Search ............................. 428/469, 472, 428/446, 448, 336, 447, 450, 701, 702, 699, 697, 698, 624

(56) References Cited

U.S. PATENT DOCUMENTS

| | | |
|---|---|---|
| 3,847,652 A | 11/1974 | Fletcher et al. |
| 4,085,285 A | 4/1978 | Lippits et al. |
| 4,096,315 A | 6/1978 | Kubacki |
| 4,168,330 A | 9/1979 | Kaganowicz |
| 4,217,038 A | 8/1980 | Letter et al. |
| 4,599,287 A | 7/1986 | Fujimaki et al. |
| 4,649,071 A | 3/1987 | Tajima et al. |
| 4,661,730 A | 4/1987 | Maruyama et al. |
| 4,737,415 A | 4/1988 | Ichijo et al. |
| 4,745,337 A | 5/1988 | Pichot et al. |
| 4,762,730 A | 8/1988 | Enke et al. |
| 4,777,090 A | 10/1988 | Ovshinsky et al. |
| 4,778,721 A | 10/1988 | Sliemers et al. |
| 4,783,374 A | 11/1988 | Custer et al. |
| 4,830,873 A | 5/1989 | Benz et al. |
| 4,842,941 A | 6/1989 | Devins et al. |
| 4,869,924 A | 9/1989 | Ito |
| 4,927,704 A | 5/1990 | Reed et al. |
| 4,980,196 A | 12/1990 | Yasuda et al. |
| 5,051,308 A | 9/1991 | Reed et al. |
| 5,061,567 A | 10/1991 | Brochot et al. |
| 5,093,152 A | 3/1992 | Bonet et al. |
| 5,135,808 A | 8/1992 | Kimock et al. |
| 5,156,882 A | 10/1992 | Rzad et al. |
| 5,168,197 A | 12/1992 | Tamba et al. |
| 5,188,862 A | 2/1993 | Itatani et al. |
| 5,190,807 A | 3/1993 | Kimock et al. |
| 5,268,217 A | 12/1993 | Kimock et al. |
| 5,273,609 A | 12/1993 | Moslehi |
| 5,279,866 A | 1/1994 | Bourget et al. |
| 5,298,587 A | 3/1994 | Hu et al. |
| 5,320,875 A | 6/1994 | Hu et al. |
| 5,370,765 A | 12/1994 | Dandl |
| 5,405,492 A | 4/1995 | Moslehi |
| 5,433,786 A | 7/1995 | Hu et al. |
| 5,449,880 A | 9/1995 | Takaki |
| 5,480,687 A * | 1/1996 | Heming et al. ............. 427/573 |
| 5,494,712 A | 2/1996 | Hu et al. |
| 5,567,661 A | 10/1996 | Nishio et al. |
| 5,618,619 A | 4/1997 | Petrmichl et al. |
| 5,643,365 A | 7/1997 | Blinov et al. |
| 5,679,413 A | 10/1997 | Petrmichl et al. |
| 5,707,452 A | 1/1998 | Dandl |
| 5,800,904 A | 9/1998 | Hallman et al. |
| 5,841,237 A | 11/1998 | Alton |
| 5,855,684 A | 1/1999 | Bergmann |
| 5,962,083 A | 10/1999 | Hatanaka et al. |
| 5,975,014 A | 11/1999 | Dandl |
| 6,010,755 A | 1/2000 | Suzuki |
| 6,040,021 A | 3/2000 | Miyamoto |
| 6,130,002 A | 10/2000 | Neumann et al. |
| 6,245,435 B1 * | 6/2001 | O'Brien et al. ............. 428/472 |
| 6,376,064 B1 * | 4/2002 | Gasworth et al. ........... 428/331 |
| 2002/0006487 A1 * | 1/2002 | O'Connor et al. ......... 428/35.7 |

FOREIGN PATENT DOCUMENTS

| | | |
|---|---|---|
| EP | 0 299 754 | 1/1989 |
| EP | 0 395 198 | 10/1990 |
| EP | 0 528 540 | 2/1993 |

* cited by examiner

*Primary Examiner*—Jennifer McNeil
(74) *Attorney, Agent, or Firm*—Michael Best & Friedrich LLP

(57) ABSTRACT

A clear protective coating including a composition having a formula $SiO_xC_yH_z$, wherein $x=0.8–1.5$, $y=1.0–2.0$, and $z=1.6–3.7$ is provided. The coating may be formed by plasma-enhanced chemical vapor deposition. The coating typically coats a substrate, and more particularly, a metal substrate. In a preferred embodiment, the coating coats an architectural hardware article, thereby providing corrosion and abrasion protection for the architectural hardware article.

13 Claims, No Drawings

CORROSION-RESISTANT COATINGS AND METHODS OF MANUFACTURING THE SAME

FIELD OF THE INVENTION

The invention relates to materials that can be used to coat substrates to inhibit corrosion. More particularly, the invention relates to optically-transparent materials used to coat metal substrates, such as architectural hardware, to eliminate tarnishing and corrosion caused by atmospheric conditions while maintaining good abrasion resistance and appearance.

BACKGROUND OF THE INVENTION

There is a substantial body of work focused on various types of coatings for metal substrates. Coatings can provide decorative and/or functional properties to the substrate. Decorative coatings are used to provide a surface with a specific appearance such as color or gloss. Functional coatings provide the substrate with other properties, e.g., abrasion resistance and corrosion resistance.

Consider the case of architectural hardware. Brass is the material that is most highly prized by the marketplace today in the United States for use on door handles, knobs, escutcheons etc. Brass, unfortunately, is prone to oxidation, tarnishing and corrosion when exposed to atmospheric conditions. These chemical processes severely affect the appearance of the brass, making it less visually appealing. Due to these tendencies for the brass to undergo corrosion, it must be protected in order to avoid the degradation of its appearance. Therefore, corrosion-resistant coatings are desired.

SUMMARY OF THE INVENTION

In one aspect, the invention provides an article comprising a substrate having an optically-transparent coating on at least a portion thereof. The coating may comprise a composition of formula $SiO_xC_yH_z$, wherein x=about 0.8–1.5, y=about 1.0–2.0, and z=about 1.6–3.7. The substrate may comprise at least one of zinc, aluminum, steel, chrome, brass and combinations thereof.

In another aspect, the invention provides a metal article comprising a metal substrate having a coating deposited thereon using physical vapor deposition (PVD). The PVD coating may comprise at least one of titanium, titanium nitride, zirconium, zirconium nitride, chromium, chromium nitride, titanium-aluminum nitride, copper, copper nitride, aluminum, nickel, tin, brass, and a combination thereof. The PVD coating may have an optically-transparent coating on at least a portion thereof. The optically-transparent coating may comprise a composition of formula $SiO_xC_yH_z$, wherein x=about 0.8–1.5, y=about 1.0–2.0, and z=about 1.6–3.7. The metal substrate may comprise at least one of zinc, aluminum, steel, chrome, brass and combinations thereof.

In yet another aspect, the invention provides a method of manufacturing a metal article. The method comprises providing a substrate, and using plasma-enhanced chemical vapor deposition to coat at least a portion of the metal article with an optically-transparent, corrosion-protective coating. The coating may include a composition of $SiO_xC_yH_z$, wherein x=about 0.8–1.5, y=about 1.0–2.0, and z=about 1.6–3.7. The article may comprise zinc, aluminum, steel, chrome, brass and combinations thereof. The method may further comprise using plasma vapor deposition (PVD) to provide a PVD coating on the substrate. The resulting PVD coating may have the optically-transparent coating on at least a portion thereof. The PVD coating may comprise titanium, titanium nitride, zirconium, zirconium nitride, chromium, chromium nitride, titanium-aluminum nitride, copper, copper nitride, aluminum, nickel, tin, brass, and a combination thereof.

Before one embodiment of the invention is explained in detail, it is to be understood that the invention is not limited in its application to the details of the construction and arrangements of the components set forth in the following description or illustrated in the drawings. The invention is capable of other embodiments and of being practiced or carried out in various ways. Also, it is understood that the phraseology and terminology used herein is for the purpose of description and should not be regarded as limiting. The use of "including," "comprising" and "having" and variations thereof herein is meant to encompass the items listed thereafter and equivalents thereof as well as additional items.

DETAILED DESCRIPTION OF THE INVENTION

Brass substrates may be coated with clear, organic coatings. Unfortunately, however, such organic coatings offer very poor abrasion and scratch resistance. Once the coating is scratched, it will allow atmospheric conditions to contact the brass, thereby allowing corrosion to occur. Initially the product is aesthetically-pleasing and is corrosion-resistant, but as the hardware is used and scratched, the appearance degrades due to corrosion in the scratched and abraded areas.

Another approach may be to coat the brass with nickel electroplate in order to provide corrosion resistance and use electroplated chromium for retention of gloss, to provide a brass-like color or some other decorative color. In this manner, one can produce architectural hardware made from brass (which the marketplace desires) that provides corrosion resistance and a brass-like appearance. Such a process allows the natural color of the brass to be viewed through the clear coating while providing corrosion protection. The issues with brass are similar to the issues for other metals used to make architectural hardware, such as zinc, steel and aluminum.

The use of optically-clear coatings provides advantages over opaque coatings. Opaque coatings necessitate the use of supplementary decorative coatings in order to achieve the appearance of the substrate prior to coating. Therefore, it is desirable to impart corrosion-resistance through the use of clear coatings to avoid this extra decorative step. Furthermore, it would be advantageous to provide a highly scratch and abrasion resistant surface through the use of a clear coating in order to minimize the problems associated with wear. For the case of the architectural hardware, the most desirable coating is a clear, abrasion resistant coating that can provide corrosion resistance. As discussed above, polymer coatings applied via dip, flow, spin or powder methods may not be sufficiently abrasion and scratch resistant to provide a long lived solution for brass hardware.

Another type of coating can be produced by plasma polymerization. Plasma polymerization refers to processes whereby an organic compound (hydrocarbon, silizane, siloxane etc.) is introduced as a vapor into a vacuum chamber containing the pieces to be treated. The vapor is polymerized via the use of a plasma generated by electromagnetic radiation such as radio frequency, microwave, electron cyclotron resonance microwave, low-frequency alternating current, direct current and the like. The vapor undergoes chemical reactions either in the gas phase or by condensation on the work piece followed by reaction into a solid coating. Plasma polymerization processes are generally characterized as low-energy. Ion bombardment is generally minimal. Such processes yield soft materials that are very similar to polymers made by more conventional methods (thermal cure, UV cure etc.).

Another class of materials has been reported in which vapors of various hydrocarbon, siloxane, silane, silizane, or blends thereof are introduced into a vacuum chamber and reacted via plasma. In this case, however, the conditions are manipulated in order to achieve much harder films. Diamond-like carbon coatings can also be employed. Another route to hard materials is by changing the chemistry by introducing oxygen or nitrogen containing species with silicon containing compounds and forming oxides and nitrides such as silicon monoxide, silicon dioxide, silicon carbide, silicon nitride, silicon carbonitride, silicon oxynitride etc. The DLC films absorb light in the visible range (400 to 700 nm) and, are therefore, not suitable for applications requiring a clear coating. Likewise the silicon carbide films are absorbing and silicon nitride films often have absorption in the visible range and, also, are not suitable for applications requiring non-absorbing materials. The silicon and oxygen containing species, however, are typically optically transparent in the visible range and can be considered as coatings for architectural hardware.

Others have attempted to produce silicon dioxide films through the use of siloxane type precursors coupled with large amounts of oxygen gas and plasma. In these processes, the large quantities of oxygen are used in order to combust with the siloxane and remove the carbon from the precursor as carbon monoxide or carbon dioxide. The carbon-containing gas is then pumped away leaving behind materials that are similar to silicon dioxide. Such silicon dioxide films are quite brittle and tend to fracture when scratched yielding an unappealing surface.

The process of corrosion of a coating/substrate system is a complex situation. The substrate, the coating, and the interface between the coating and substrate may all be subject to corrosion. One approach to stopping corrosion is to provide a barrier that eliminates movement of oxygen, water, and other species to the substrate. For the case of brass, this would mean eliminating the pathway for oxygen and water (and any other contributing species) to the brass substrate by using a barrier coating. It is well known that polymer powder coatings provide good corrosion resistance on brass substrates if properly applied. For example, the application of a typical acrylic powder coating to a brass substrate will allow it to pass a minimum of 200 hours in a salt fog test (ASTM B-117). It is also well known that polymer coatings are notoriously poor barriers to oxygen and water (see for example Battelle work). To pass this industry standard test an impervious barrier coating (such as those used on organic light emitting diodes) may not be necessary. Uncoated brass corrodes rapidly in ASTM B-117. The knowledge that the brass corrodes readily in ASTM B-117 and that the polymer coatings are not good barriers suggests the interface between the brass and the polymer may play a role in the corrosion resistance of the coated system. One can speculate that if the interface is inherently corrosion resistant, then the interfacial layer protects the substrate. This implies that the interfacial chemistry will be the most influential factor in building a corrosion resistant system for the case of coatings that are not inherently good barriers.

The following U.S. Patents are hereby fully incorporated by reference: U.S. Pat. No. 4,085,285; U.S. Pat. No. 4,096,315; U.S. Pat. No. 4,168,330; U.S. Pat. No. 4,217,038; U.S. Pat. No. 4,649,071; U.S. Pat. No. 4,661,730; U.S. Pat. No. 4,762,730; U.S. Pat. No. 4,777,090; U.S. Pat. No. 4,778,721; U.S. Pat. No. 3,847,652; U.S. Pat. No. 4,783,374; U.S. Pat. No. 4,830,873; U.S. Pat. No. 4,842,941; U.S. Pat. No. 4,927,704; U.S. Pat. No. 4,980,196; U.S. Pat. No. 5,061,567; U.S. Pat. No. 5,093,152; U.S. Pat. No. 5,135,808; U.S. Pat. No. 5,190,807; U.S. Pat. No. 5,268,217; U.S. Pat. No. 5,298,587; U.S. Pat. No. 5,567,661; U.S. Pat. No. 5,679,413; and U.S. Pat. No. 5,618,619; European Patent No. 0299754; European Patent No. 0395198; and European Patent No. 0528540.

The invention provides a number of protective coatings as well as methods for making the coatings. The coatings may be optically-transparent and corrosion-resistant and suitable for use on a wide variety of substrates and, more particularly, metal substrates. In one aspect, the invention provides a metal article comprising a metal substrate having an optically-transparent coating on at least a portion thereof. In another aspect, the invention provides a metal article comprising a metal substrate having a coating deposited thereon using physical vapor deposition (PVD). The PVD coating may comprise titanium, titanium nitride, zirconium, zirconium nitride, chromium, chromium nitride, titanium-aluminum nitride, copper, copper nitride, aluminum, nickel, tin, brass, or a combination thereof. The PVD coating may have an optically-transparent coating on at least a portion thereof. In yet another aspect, the invention provides a method of manufacturing a metal article comprising providing a metal article, and using plasma-enhanced chemical vapor deposition to coat at least a portion of the metal article with an optically-transparent, corrosion-protective coating. This method may further comprise using plasma vapor deposition (PVD) to provide a PVD coating on the metal substrate, wherein the PVD coating has the optically-transparent coating on at least a portion thereof.

As discussed herein, the coatings defined herein may be applied directly to a portion of or the entire substrate or article. Additionally, the coating may be applied indirectly to a portion of or the entire substrate. In other words, there may be other intermediate layers or substances between the substrate or article and the coating. Consequently, when articles or substrates are described as "having a coating deposited thereon," "having a coating on at least a portion thereof," or processes are described as "using a particular deposition process to coat at least part of a substrate or article," the coating may be directly or indirectly "deposited on" or "on" the article or substrate. A coating being indirectly "deposited on" or "on" a substrate or article means that an intermediate layer or substance may be found therebetween. Furthermore, coating, depositing, applying coatings etc. should all be construed to mean directly or indirectly coating, applying or depositing a coating onto a substrate or article.

Examples of metal substrates include, but are not limited to, brass, zinc, steel, aluminum, chrome and combinations thereof. In addition, other examples of metal substrates include, but are not limited to, substrates comprising brass, zinc, steel, aluminum, chrome, and combinations thereof. In addition, other substrates include brass-plated and brass-colored surfaces. Furthermore, molded plastic may also be used as a base material or substrate. Therefore, the substrate need not be metal. The metal may be easily polished or finished to a satin surface and then directly coated over with a metal nitride, carbonitride, or carbide to produce the desired color (e.g. TiN for gold, ZrN for brass, CrN for chrome). More specifically, the metal or non-metal article or substrate may have a coating deposited thereon using physical vapor deposition (PVD). The PVD coating may comprise titanium, titanium nitride, zirconium, zirconium nitride, chromium, chromium nitride, titanium-aluminum nitride, copper, copper nitride, aluminum, nickel, tin, brass, or a combination thereof. Accordingly, the combinations of metal substrates and PVD coatings provide for a wide variety of metal articles to which the coatings described herein may be applied.

The coatings provide corrosion protection while maintaining good abrasion resistance for the substrate on which it is used. Specific metal substrates to which the coatings can be applied include, but are not limited to, architectural hardware articles such as door handles, door levers, door grips, appliance handles, handrails, escutcheons, knobs, and articles generally classified as trim, decorative trim or combinations thereof. These trim parts comprise decorative and/or functional parts of architectural hardware that are visible or positioned on the exterior sides of the architectural hardware and include what are termed exterior (exposed to the weather) and interior trim (usually inside a building).

The coatings described herein comprise silicon, carbon, oxygen and hydrogen in specified ranges and specified empirical formulas. The compositions have the general formula $SiO_xC_yH_z$, wherein x is about 0.8 to about 1.5; y is about 1.0 to about 2.0; and z is about 1.6 to about 3.7. Preferably, the coatings may be applied in a thickness greater than about 5 $\mu$m, and more particularly, greater than about 9 $\mu$m. Typically, the thickness is less than about 17 $\mu$m, and more particularly, less than about 11 $\mu$m. Ideally, the thickness is between about 5 $\mu$m and about 17 $\mu$m. Coatings having a thickness ranging between 5 to 17 $\mu$m on polished brass samples have passed the 200 hour exposure time in ASTM B 117 salt spray testing as described in more detail below.

Coatings which can pass the ASTM B 117 salt spray testing are particularly desired because these coatings demonstrate good corrosion and abrasion characteristics which are useful in protecting a metal substrate of, e.g., an architectural hardware article. As used herein, the term "corrosion-protective" means a substance having good anti-corrosion characteristics. Any coating that protects against corrosion would be considered "corrosion-protective." Typically, the coatings are clear or optically-transparent and tend to preserve the appearance of the metal substrate found beneath the coating. In other words, in an architectural hardware application, the coatings are clear so that the aesthetically pleasing appearance of the metal is still visible, while the coating still protects the metal substrate from corrosion, abrasion and chipping. The compositions described herein are particularly well-suited for architectural hardware due to the coating's hardness.

Preferably, the coatings and compositions are made using microwave electron cyclotron resonance plasma enhanced chemical vapor deposition ("ECR PECVD"), which is described in more detail below. Very briefly, the coatings made using this method are produced by gasifying a precursor containing the desired metallic element and injecting it into a reduced pressure chamber in which a plasma has been generated by an ECR plasma source. The plasma causes reaction of the precursor resulting in a coating on the substrate. The parts are moved within the chamber by a carousel device to assure complete and uniform coverage. The oxide coatings are very adherent, clear and resistant to both corrosion and mechanical damage. They also provide a long-lasting protective covering to the decorative appearance of the underlying metal. Other suitable techniques for making the coatings include, but are not limited to other processes for igniting and sustaining a plasma, such as radio frequency excitation, Direct Current (DC), low frequency alternating current, high frequency alternating current, microwave, and so on.

Before the coatings are applied to the metal substrates, however, the metal substrate to which the coating is to be applied may be initially polished and cleaned. For example, when using a brass sample or part, the brass may be polished to provide a high gloss finish and then cleaned. These procedures may be performed using a combination of polishing compound applied to the substrate and then buffing the substrate with a combination of soft surface belts and/or polishing wheels. The polished substrate may then be cleaned with an aqueous multi-step cleaning process and an ultrasonic assist as needed. Cleaning methods are well-known and practiced in the industry for architectural hardware and other decorative product industries.

The coating of the substrate by PECVD takes place in a chamber, subsequent to the cleaning of the substrate. In one embodiment, a chamber used to make vacuum coatings may be obtained from PlasmaQuest (now ASTeX) which is located in Woburn, Mass. In one preferred embodiment, the chamber is a non-magnetic stainless steel vacuum chamber having a 27.5-inch inside diameter and 48-inch axial length oriented with the axis horizontal. The chamber has full-size doors on both ends that allow access to the inside of the chamber. These doors provide a vacuum seal when they are closed. Each has an ISO 100 flanged port with a window to allow observation of the process from the outside. Instrumentation probes for measurement of the plasma or other parameters may be passed through the ports during operation. Three ISO 160 flanged ports on the top and one ISO 250 flanged port on the bottom of the chamber allow gas lines, electrical, rotary drive shafts or other feed-throughs to enter the chamber without compromising the vacuum conditions inside. Each side has three ISO 250 flanged ports. On one side, ports are positioned halfway along the length position at around 14.5 inches in front and in back. The ports are used to transmit energy from microwave sources through microwave transparent windows, e.g. silica, and into the chamber. On the opposite side of the chamber, three ports at the same positions along the length may be connected to vacuum pumping systems. In a preferred embodiment, a mechanical roots pump blower with backup is attached at the center port.

The vacuum chamber porting allows up to three microwave ECR inputs to be attached along one side to provide high power and the desired distribution of plasma density throughout the chamber. The ECR inputs generally comprise a power supply, magnetrons, wave guides, auto tuners, an air cooling system for the microwave transparent window, water cooled gas introduction window flanges and associated cabling. One example of a suitable chamber is model number A50RM manufactured by AsTEX Corporation located in Woburn, Mass. This ECR system is a 5,000 W permanent magnet microwave power source fully assembled and attached to the chamber through one of the microwave ports on the chamber.

In a preferred embodiment, parts prepared to the desired surface finish are first cleaned using one of the multistep aqueous caustic plus neutral or acid cleaning processes with intermediate and final deionized water rinses using processes well-known and practiced in industry. Preferably, the parts are then exposed to a final hot air dry. The parts are then placed on racks or other suitable parts holders. Preferably, these parts are then rotated in the chamber. One manner by which the metal substrates may be coated is to use a set up similar to rotating planets on a revolving circular sun gear. Other ways the part may be rotated include a rotating carousel with additional rotation of the substrates on the carousel. A rotating method assures uniform exposure and coating of all surfaces of three-dimensional parts. Flat samples for testing purposes may simply be mounted on fixed supports at the desired position and orientation. Alternatively, the part may be moved through the chamber by a conveyor system. Such methods are widely practiced in production processes such as Physical Vapor Deposition (PVD) of coatings on substrates and are well known to those skilled in the art. A bias voltage may be supplied to the parts if ion acceleration to the substrate is desirable.

Once the parts are positioned in the chamber, the chamber is pumped down to a base pressure preferably less than 15 mTorr by a vacuum system (blower) attached to the chamber. In other words, the chamber is preferably evacuated prior to the initiation of the plasma pre-clean and coating processes. Preferably, the substrate temperature is maintained at a temperature of more than 100 degrees Celsius. The vacuum pumping system (blower) is a mechanical system comprising an HV7000F Booster Pump with a backup GV600F Dry Vacuum Pump. This system may be supplied by BOC Edwards of Grand Island, N.Y. Once the vacuum system removes the external atmosphere, oxygen is fed into the chamber at a predetermined flow level. Preferably the flow level is 100 sccm. At this point, the microwave ECR is energized and adjusted to generate an oxygen plasma that provides a final chemical fine cleaning of the surface and conditions it for coating. Other plasmas which can be used for the plasma pre-clean include, but are not limited to, Argon. Typically, the final chemical cleaning of the part continues for about 3 minutes. The plasma pre-clean may include power input to the ECR plasma source of around 1,000 Watts.

Preferably, the coating is then produced using the PECVD method described in more detail below. Other plasma generation methods, however, may be used to generate the compositions and coatings described herein. For example, 250 sccm of $O_2$, 250 sccm of the precursor gas, in this case, octamethylcyclotetrasiloxane (OMCTS) and 3,000 Watts of power to the ECR plasma source to get an approximately 10 $\mu$m thickness of coating. While other plasma generation methods may be used, the microwave ECR method is preferred when coating metal objects having significant numbers of three-dimensional parts.

In plasma-enhanced chemical vapor deposition (PECVD), however, the required energy is supplied by the energetic plasma. A plasma is a cloud of electrons, ions and neutrals having a net total charge near zero. The plasma can be generated using an electrical discharge from DC, RF or other electric field. When using microwave ECR plasma generation, a magnetic field is used to contain electrons stripped from gas molecules while they are accelerated to high energy levels by circularly polarized microwaves. The strength of the magnetic field at the ECR condition is matched to the frequency of a rotating electric vector of a microwave in order to hold the electrons in circular orbits while they are accelerated to high velocities. The overall plasma temperature remains relatively low since the acceleration of ions, being thousands of times more massive than electrons, is insignificant. The high-energy electrons' interactions with the bonding electrons of the gas molecules results in chemical breakdown while low gas and substrate temperatures are maintained. Typically, the substrate temperature is about 100 or more degrees Celsius.

The selection of precursors and plasma gases and ratios of their flow will affect the final chemistry of the coating produced. The desired coatings comprise the elements silicon (Si), carbon (C), oxygen (O) and hydrogen (H). Accordingly, the precursors and plasma gases combined and used to form the coatings must contain these elements. Some precursor gases may supply all of the necessary elements. Other precursor gases, however, may require some additional gas input to supply the remaining elements. For instance, if silane ($SiH_4$) is used, additions of a hydrocarbon such as acetylene ($C_2H_2$) with an oxygen plasma gas will be required to supply the necessary carbon and oxygen. Oxygen as a plasma gas is useful in burning off unwanted carbon and hydrogen as gaseous CO, $CO_2$, $H_2O$, $H_2$, etc. which are removed by the vacuum pump. Argon may also be used as an inert plasma gas either alone or with added oxygen.

Examples of precursors providing silicon includes, but are not limited to, silane, disilane, substituted silanes and substituted disilanes or a siloxane. More specific examples include tetraethyloxysilane (TEOS), hexamethyldisiloxane (HMDSO), hexamethylcyclotrisiloxane (HMCTSO), octamethylcyclotetrasiloxane (OMCTS) or 1,3,5,7-tetramethylcyclotetrasiloxane (TMCTS). Examples of precursors supplying carbon include, but are not limited to, $C_2H_2$, CO, and $CO_2$. Examples of precursors supplying oxygen include, but are not limited to, CO, $C_2$ and $O_2$. Examples of precursors supplying hydrogen include, but are not limited to, $C_2H_2$, and $H_2$. The chemical precursors are vaporized and delivered into the vacuum system using commercially available equipment known to those skilled in the art such as, but not limited to, MKS Model 1150, MKS Model 1153, MKS Model DLI 25, etc. The precursors are fed into the plasma using standard gas introduction manifolds known to those skilled in the art.

A microwave ECR plasma will diffuse to fill a chamber and is not contained between plates as with a DC discharge. Microwave-ECR-generated plasmas are thus ideal in conjunction with PECVD coatings of three-dimensional parts in large chambers. One or more microwave ECR generators may be provided in the same chamber to supply a large plasma cloud sufficiently energetic to activate precursors over the entire chamber volume. The plasma cloud containing the fragmented precursors then surrounds the metal substrate or part to be coated. The plasma cloud then forms a coating thereon when it comes into contact with these surfaces. Thus, it is not a "line-of-sight" process like physical vapor deposition (PVD). The parts may be moved through the chamber (rotated) during the coating process to provide a uniform coating thickness on all surfaces. The plasma gas is introduced into the coating chamber through the ECR zone. Preferably, the plasma gas is oxygen or argon.

Once the gaseous precursor or precursors enter the chamber and encounter the energetic plasma, the precursor or precursors begin to break down and react with the plasma gas. Some of these components will impinge on surfaces, in particular those of the parts to be coated, and combine to form a coating. When the power and plasma gas to precursor flow ratio are properly selected, a coating within the desired chemistry ranges is produced. The process continues until the desired coating thickness range is achieved. Again, the resulting coating has an empirical formula of $SiO_xC_yH_z$, wherein x=about 0.8 to about 1.5; y=about 1.0 to about 2.0; and z=about 1.6–3.7. The materials were produced in the form of a clear coating on a metal substrate by a PECVD process with gaseous precursors containing the elements silicon, carbon, oxygen and hydrogen. The precise chemistry of the coating depends on plasma power levels, precursor type and flow rate, and plasma gas type and flow rate. Plasma power levels can range from about 1,000 Watts to about 5,000 Watts; precursor type and flow rate can vary from about 100 sccm to about 500 sccm; and the plasma gas flow rate may be about 100 sccm to about 500 sccm. Coatings of this chemistry made by this method have been shown to provide a minimum of 200 hours protection in ASTM B117 salt fog.

EXAMPLES

Nine examples are presented below. Each example was processed using the following common conditions. The sample material tested in each example was a C26000 brass sheet. The brass sheets were polished to provide a mirror-like surface comparable to commercially-available architectural hardware. Each sample was mounted and fixed directly in front of the ECR source in the center of the chamber having a center-located microwave ECR power supply. Cleaning in the chamber was conducted under the following conditions: gas—$O_2$ @ 120 sccm; power—1000 w; time—3 min. The vacuum pump for each of the examples was a blower (Edwards HV7000F Booster Pump with a backup GV600F Dry Vacuum Pump), with pressures set at 10 to 20 mTorr.

Each of the following examples uses a different combination of microwave ECR power, precursor, and precursor flow and plasma gas flow to produce coatings within the claimed composition ranges. Each of the coatings in the Examples passed the 200 hour salt spray test goal. Charles Evans and Associates performed the chemical analyses of the resultant coatings. The methods used were Rutherford Back Scattering (RBS) to analyze silicon, carbon and oxygen, and Hydrogen Forward Scattering (HFS) to analyze hydrogen.

Example 1 (RPRC-R4010326)

Plasma gas: $O_2$
Precursor: OMCTS
Precursor flow rate: 250 sccm
$O_2$ flow rate: 1,000 sccm
Microwave ECR power: 3000 W
Composition: $SiO_{1.89}C_{0.97}H_{1.02}$
Thickness: 12.330 μm
Salt-spray time to failure: 3094 hours

Example 2 (RPRC-R1010326)

Plasma gas: $O_2$
Precursor: OMCTS
Precursor flow rate: 250 sccm
$O_2$ flow rate: 250 sccm
Microwave ECR power: 3000 W
Composition: $SiO_{1.35}C_{1.38}H_{1.92}$
Thickness: 13.510 μm
Salt-spray time to failure: 4429 hours

Example 3 (PVSD-R4010224)

Plasma gas: Ar
Precursor: OMCTS
Precursor flow rate: 200 sccm
Ar flow rate: 200 sccm
Microwave ECR power: 2000 W
Composition: $SiO_{1.09}C_{1.17}H_{2.17}$
Thickness: 10.670 μm
Salt-spray time to failure: 3975 hours

Example 4 (PVSD-R6010226)

Plasma gas: $O_2$
Precursor: OMCTS
Precursor flow rate: 300 sccm
$O_2$ flow rate: 187.5 sccm
Microwave ECR power: 2000 W
Composition: $SiO_{1.08}C_{1.17}H_{1.95}$
Thickness: 9.999 μm
Salt-spray time to failure: 1997 hours

Example 5 (PVSD-R6010224)

Plasma gas: Ar (deposition started with oxygen on for first 10 seconds)
Precursor: OMCTS
Precursor flow rate: 400 sccm
Ar flow rate: 400 sccm
Microwave ECR power: 2000 W
Composition: $SiO_{1.09}C_{1.18}H_{2.09}$
Thickness: 16.820 μm
Salt-spray time to failure: 2252 hours

Example 6 (PPOD-R1010306)

Plasma gas: none (deposition started with oxygen on for first 30 seconds)
Precursor: HMDSO
Precursor flow rate: 100 sccm
$O_2$ flow rate: 100 sccm
Microwave ECR power: 500 W
Composition: $SiO_{0.88}C_{1.88}H_{3.60}$
Thickness: 9.968 μm
Salt-spray time to failure: 1150 hours

Example 7 (PPOD-R2010308)

Plasma gas: none (deposition started with oxygen for first 30 seconds)
Precursor: OMCTS
Precursor flow rate: 100 sccm
$O_2$ flow rate: 100 sccm
Microwave ECR power: 2000 W
Composition: $SiO_{1.15}C_{1.43}H_{1.76}$
Thickness: 8.275 μm
Salt-spray time to failure: 2460 hours

Example 8 (SPHC-R1010221)—Six Samples

Plasma gas: $O_2$
Precursor: OMCTS
Precursor flow rate: 250 sccm
$O_2$ flow rate: 250 sccm
Microwave ECR power: 2000 W
Composition: $SiO_{1.47}C_{1.59}H_{2.19}$
Thickness, Salt-spray time to failure: 6 examples—(5.099 μm, 2249 hours; 7.877 μm, 1894 hours; 8.134 μm, 1940 hours; 12.300 μm, 1543 hours; 9.786 μm, 1472 hours; 9.332 μm, 4088 hours)

Example 9 (RPRC-R2010326)

Plasma gas: $O_2$
Precursor: OMCTS

Precursor flow rate: 250 sccm
$O_2$ flow rate: 250 sccm
Microwave ECR power: 5000 W
Composition: $SiO_{1.16}C_{1.17}H_{1.72}$
Thickness: 12.120 μm
Salt-spray time to failure: 663 hours

We claim:

1. An article comprising: a substrate having an optically-transparent coating on at least a portion thereof, the coating comprising a composition of formula $SiO_xC_yH_z$, wherein x=about 0.8–1.5, y=about 1.0–2.0, and z=about 1.6–3.7, wherein the coating has a thickness greater than 5 μm, the article is an architectural hardware item chosen from a door handle, door lever, door grip, appliance handle, hand rail, an escutcheon, a knob, trim, decorative trim hardware and combinations thereof, and the substrate comprises metal.

2. The article of claim 1, wherein the coating is about 5 μm to about 17 μm thick.

3. The article of claim 1, wherein the coating protects the article from corrosion for a minimum of 200 hours when exposed to an ASTM-B117 salt-fog test.

4. The article of claim 1, wherein the substrate is metal plated.

5. The article of claim 1, wherein the coating is applied to the substrate using plasma-enhanced chemical vapor deposition.

6. An article comprising: a substrate having an optically-transparent coating on at least a portion thereof, the coating comprising a composition of formula $SiO_xC_yH_z$, wherein x=about 0.8–1.5, y=about 1.0–2.0, and z=about 1.6–3.7, wherein the coating has a thickness greater than 5 μm, and the substrate comprises at least one of brass, zinc, aluminum, steel, and chrome.

7. An article comprising: a substrate having a coating deposited thereon using physical vapor deposition (PVD), the PVD coating comprising at least one of titanium, titanium nitride, zirconium, zirconium nitride, chromium, chromium nitride, titanium-aluminum nitride, copper, copper nitride, aluminum, nickel, tin, brass, and combinations thereof, the PVD coating having an optically-transparent coating on at least a portion thereof, the optically-transparent coating comprising a composition of formula $SiO_xC_yH_z$, wherein x=about 0.8–1.5, y=about 1.0–2.0, and z=about 1.6–3.7, and wherein the coating has a thickness greater than 5 μm.

8. The article of claim 7, wherein the coating is greater than 5 μm to about 17 μm thick.

9. The article of claim 7, wherein the optically-transparent coating protects the article from corrosion for a minimum of 200 hours when exposed to an ASTM-B117 salt-fog test.

10. The article of claim 7, wherein the article is an architectural hardware item.

11. The article of claim 10, wherein the architectural hardware item is chosen from a door handle, door lever, door grip, appliance handle, hand rail, an escutcheon, knob trim, decorative trim hardware and combinations thereof.

12. The article of claim 11, wherein the optically-transparent coating is applied using plasma-enhanced chemical vapor deposition.

13. The article of claim 7, wherein the metal substrate comprises at least one of zinc, aluminum, brass, chrome, and steel.

* * * * *